United States Patent [19]
Finch et al.

[11] 4,155,109
[45] May 15, 1979

[54] PLANAR BOARD AND CARD-ON-BOARD ELECTRONIC PACKAGE ASSEMBLY

[75] Inventors: Larry R. Finch, Newark Valley; Joseph D. Roche, Endicott; Paul M. Rogers, Apalachin, all of N.Y.

[73] Assignee: International Business Machines Corporation, Armonk, N.Y.

[21] Appl. No.: 862,083

[22] Filed: Dec. 19, 1977

[51] Int. Cl.² .............................................. H02B 1/02
[52] U.S. Cl. .................................... 361/413; 361/415
[58] Field of Search ............ 339/75 M, 75 MP, 92 M, 339/18 B, 42, 176 MP; 361/415, 413

[56] References Cited

U.S. PATENT DOCUMENTS

| | | | |
|---|---|---|---|
| 3,035,243 | 5/1962 | Bowling | 339/75 M |
| 3,043,925 | 7/1962 | Wilson | 339/92 M |
| 3,129,044 | 4/1964 | Lyman, Jr. et al. | 339/75 M |
| 3,474,387 | 10/1969 | Krum et al. | 339/92 M |
| 4,050,758 | 9/1977 | Curley | 339/176 MP |

OTHER PUBLICATIONS

"Design Trends", Electro-Technology, 4-1961, p. 166.
Allen et al., "Card on Segmented Board Electronic Package", IBM Technical Disclosure Bulletin, vol. 19, No. 1, 6-1976, pp. 51-52.

Primary Examiner—David Smith, Jr.
Attorney, Agent, or Firm—Gerald R. Gugger

[57] ABSTRACT

An electronic package assembly having means for providing direct interconnection for one or more planar electronic circuit boards with a nearly conventional card-on-board circuit package. Electrical interconnection between the card-on-board package and the planar boards is accomplished with the use of interposer cards that utilize a pin and spring blade contact system and printed circuitry to connect corresponding pins on the planar boards and the card-on-board package. The mechanical advantage necessary to overcome the spring contact force encountered in insertion and extraction of the planar boards is provided by a unique lever arrangement which latches and unlatches the planar boards.

6 Claims, 4 Drawing Figures

PLANAR BOARD AND CARD-ON-BOARD ELECTRONIC PACKAGE ASSEMBLY

BACKGROUND OF THE INVENTION

Low end systems, which are small computer systems in the order of the size of a desk, must utilize all available memory and engine cards to control system design costs. The logic heart of these systems are large functional planar boards which provide the lowest cost packaging approach from the standpoint of design, build, and test service. These boards provide the necessary memory, logic, and computing functions for a low end computer system and they are larger in size and have more components mounted on a single plane compared to conventional printed circuit cards. Also, planar boards are interconnected at their planar surface whereas printed circuit cards are generally interconnected along an edge which connects their planar surfaces.

Heretofore, these planar boards have been connected to the computer system by cables and they were fastened to the machine at a location remote from the card-on-board assembly. This required a costly assembly procedure. Also, the removal of planar boards for replacement or interchanging proved to be cumbersome, time consuming, and costly. The intricate cabling had to be disconnected and the board unscrewed from the machine frame which required generally about one hour. It became evident that what was needed was a totally integrated package at the lowest possible total system cost and wherein planar boards could be easily and quickly inserted or extracted.

SUMMARY OF THE INVENTION

The present invention provides the desired and improved totally integrated package. In the package, means are provided for direct interconnection of one or more planar electronic circuit boards with a nearly conventional card-on-board circuit package. A metallic framework provides the base from which the rest of the components are supported. The card-on-board package is bolted directly to an internal surface of the frame. Electrical interconnection between the card-on-board package and the planar boards is accomplished with the use of interposer cards which utilize a spring blade contact system and printed circuitry to connect corresponding I/O or input-output pins on the planar boards and the card-on-board package. For serviceability, the planar boards are made pluggable and accordingly the interposer cards are held in place and aligned by retainers. Guide pins in the retainers prevent connector pin damage on the planar boards by providing positive alignment with the interposers. The mechanical advantage necessary to overcome the spring contact force encountered in insertion and extraction of the planar boards is provided by levers which latch in slots in the planar board stiffeners while pivoting in detent blocks. The detent blocks also provide positive retention of the planar boards by holding the levers in the open and closed positions.

The present system allows the insertion and removal of planar boards either singly or in pairs and also allows complete interchangeability of planars. The removal and replacement of the boards can be accomplished within one minute as opposed to the previous requirement of one hour.

Accordingly, a primary object of the present invention is to provide a novel and improved planar board and card-on-board electronic package assembly.

A further object of the present invention is to provide an electronic package assembly wherein planar circuit boards are pluggably interconnected with a card-on-board electronic assembly.

A still further object of the present invention is to provide an electronic package assembly wherein planar circuit boards are pluggably interconnected with a card-on-board electronic assembly and wherein assembly and disassembly of the planar boards as well as their positive locking, fool proof orientation, and field replacement handling are accomplished with a unique leverage system.

Another object of the present invention is to provide an electronic package assembly wherein planar circuit boards are pluggably interconnected with a card-on-board electronic assembly by means of pins and spring blade contacts and a novel leverage system is provided to engage and disengage the pins and spring blade contacts.

The foregoing and other objects, features and advantages of the invention will be apparent from the following more particular description of a preferred embodiment of the invention, as illustrated in the accompanying drawings:

DESCRIPTION OF PREFERRED EMBODIMENT

Figure 1:
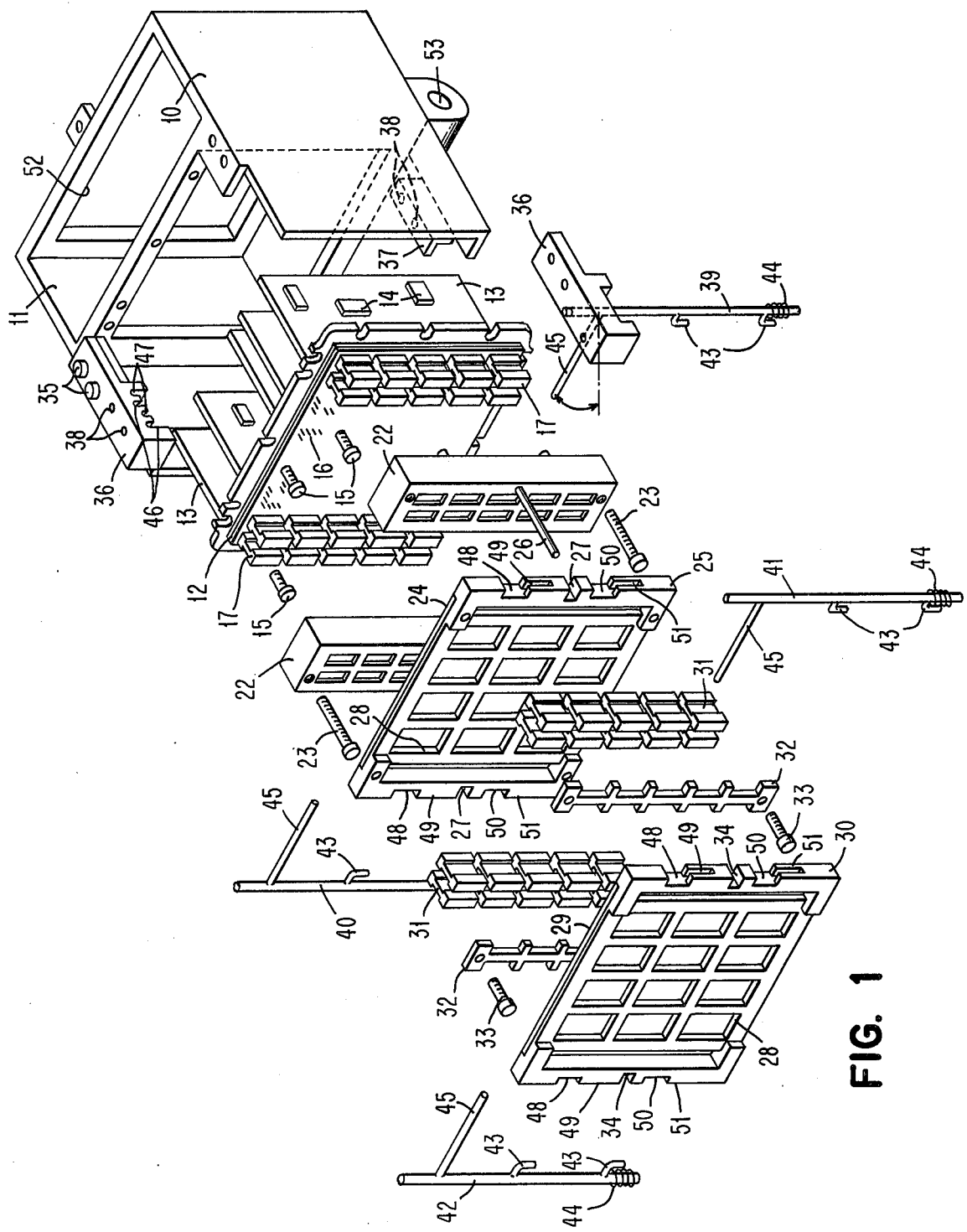
FIG. 1 is an exploded isometric view of the planar board and card-on-board package assembly of the present invention.

Referring to FIG. 1, there is shown a metallic framework 10 which is pivotally mounted onto the computer and which supports the planar board and card-on-board package assembly. The framework has a cabinet section 11 which is adapted to receive the card-on-board assembly which comprises a printed circuit board 12 and a plurality of printed circuit cards 13 which carry electronic components 14. The printed circuit cards are arranged laterally across one side of the circuit board and are electrically connected thereto in a well-known manner by edge connectors which pluggably receive I/O pins on the board. The circuit card-on-board assembly fits into the cabinet section 11 and is fastened thereto by screws 15.

Figure 2:
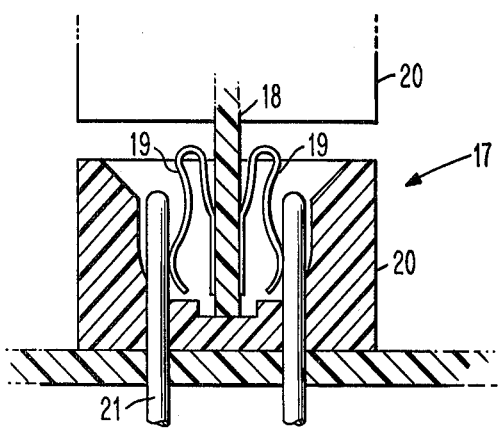
FIG. 2 is a partial view of an interposer and showing its printed circuit card and some of its spring blade contacts.

On the other side of the circuit board are a plurality of I/O pins 16 and extending along each vertical edge of the board are a plurality of individual interposer members or cards 17 which are pluggably connected to I/O pins on the board. The interposer members are arranged in two vertical rows of five each along each vertical edge of the board. As partially shown in FIG. 2, each interposer member 17 comprises a printed circuit card 18 having a row of spring blade contacts 19 soldered to each side of the card and which extend along one edge of the card. In similar fashion, extending along the opposite edge (not shown) of the card there is also a row of the spring blade contacts 19 soldered to each side of the card. The card extends between a pair of similar housings 20 which encase the rows of spring blade contacts and which have socket openings 21 for plugging I/O pins in contact with the spring blades. The interposer members 17 are encased in retainer members 22 which in turn are fastened to the printed circuit board by screws 23. The retainers serve to align the interposer members and hold them in place.

Interposer members 17 function to connect I/O pins on the printed circuit board 12 with corresponding I/O pins on a planar circuit board 24 mounted to one side of a rectangular stiffener member 25. Each retainer member 22 has fastened thereto a guide pin 26 and stiffener 25 is provided with a horizontal slot 27 at each vertical side so that the stiffener may be moved along on the guide pins and the I/O pins on the planar board 24, which are similar to the I/O pins 16 on the printed circuit board, will be in positive alignment with the interposer members and pin damage will be prevented upon contact engagement. Slots 48 and 50 are arranged to provide positive orientation of the planar board to maintain electrical integrity. Instead of using horizontal slots, a suitable guide hole could be provided at each vertical side of the stiffener which would fit on the guide pins 26. Stiffener 25 has a plurality of windows 28 to facilitate cooling of components mounted on the planar circuit board.

In the embodiment shown, the package assembly includes, in similar fashion, a second planar board 29 mounted to one side of a rectangular stiffener member 30. Also, another pair plurality of interposer members or cards 31 are provided which are the same as interposer member 17. Interposer members 31 have the same vertical rows arrangement along the vertical edges of planar board 24 as interposers 17 do along the vertical edges of printed circuit board 12 and interposer members 17 and 31 are in alignment with each other. Interposer members 31 are mounted in retainer members 32 which in turn seat into and are fastened to the stiffener member 25 by screws 33 so that interposer members 31 are pluggably engaged with I/O pins on planar board 24. Stiffener member 30 is also provided with a horizontal slot 34 or a suitable guide hole at each vertical side so that the stiffener may be moved along on the guide pins 26 and I/O pins on planar board 29 will be in correct alignment to be plugged into the interposer members 31.

As was previously mentioned, a unique lever arrangement is provided which latches and unlatches the planar boards and which overcomes the spring contact force encountered in the interposer members. Fastened to the top of the framework 10 by means of screws 35 are two detent blocks 36, one on each side of the framework. Also, fastened near the bottom of the framework are two support brackets 37 which are in alignment with the detent blocks. Each detent block and bracket has two thru-holes 38 with the holes in the detent blocks being in alignment with the holes in the brackets. The detent blocks and brackets pivotally support four levers 39, 40, 41 and 42. The top ends of the levers fit into the holes in the detent blocks and the bottom ends into the holes in the brackets with the levers 39 and 40 positioned across from each other for coaction with stiffener 25 and levers 41 and 42 positioned across from each other for coaction with the stiffener 30.

Each lever is provided with two hook-shaped latching fingers 43 and a spring 44 is provided at the end of each lever which extends between the lower finger 43 and the bracket 37 such that all of the levers are biased upward and a laterally extending arm 45 on each lever will bear against the undersurface of its associated detent block. The underside of each detent block is provided with two deep notches 46 and two shallow notches 47 arranged alternately in a row as shown. These notches are adapted to receive a portion of the arms 45 of the levers and arms 45 will be biased to seat into either the deep notches or the shallow notches depending on which direction the levers are pivoted. The shallow notches extend partially straight across the blocks whereas the deep notches are slanted somewhat to allow seating of arms 45 when they are pivoted toward the deep notches.

The planar board stiffeners 25 and 30 each have provided along their vertical side edges an upper horizontal slot 48, an upper vertical slot or channel portion 49, a lower horizontal slot 50, and a lower vertical slot or channel portion 51. These horizontal and vertical slots are adapted to receive the fingers 43 of the levers when the stiffeners and boards are inserted into the assembly.

Figure 3:
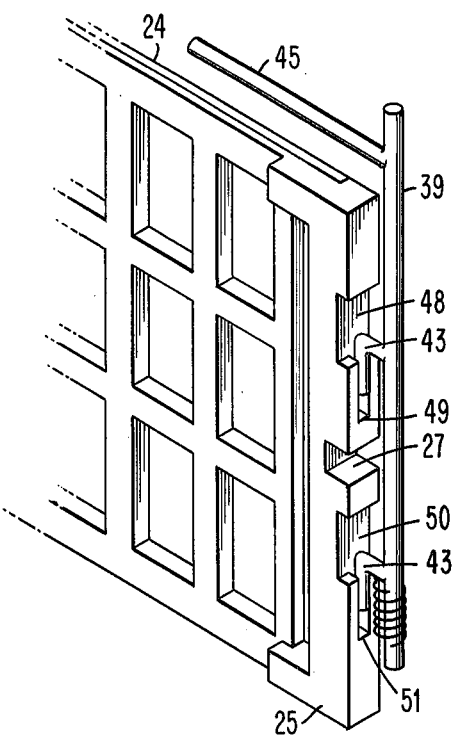
FIG. 3 is an isometric view showing a planar board in latched position.

Before loading the planar boards into the assembly, the levers 39, 40, 41 and 42 are positioned so that their arms 45 are seated in the deep notches 46 in the detent blocks. This places the levers in a raised position. Then planar board 24 and stiffener 25 is inserted onto the guide pins 26 and moved to a position against the interposers 17 connected to the printed circuit board. In this movement, the horizontal slots 48 and 50 on the stiffener clear and pass the fingers 43 of the outer set of levers 41 and 42 which provides positive orientation and when positioned against the interposers, the fingers on the inner set of levers 39 and 40 will be positioned in these slots. The arms on levers 39 and 40 are now pressed downward out of the deep notches 46 to position the fingers on these arms down into the vertical slots 49 and 51 on the stiffener, as shown in FIG. 3. Then, the levers are pivoted to position their arms into the shallow notches 47. This movement causes the fingers to coact with the vertical slots to move the board 24 and stiffener 25 against the interposers 17 with sufficient force to overcome the spring contact force encountered whereby the I/O pins on the board will plug into positive engagement with the spring blade contacts in the interposers 17. The arms of levers 39 and 40 being spring biased into the shallow notches provides a latch for poitive retention of the planar board 24.

Insertion of the second planar board 29 and stiffener 30 and operation of its associated levers 41 and 42 is carried out in the same manner as described above to bring the I/O pins on the board into positive engagement with the spring blade contacts in interposers 31.

Figure 4:
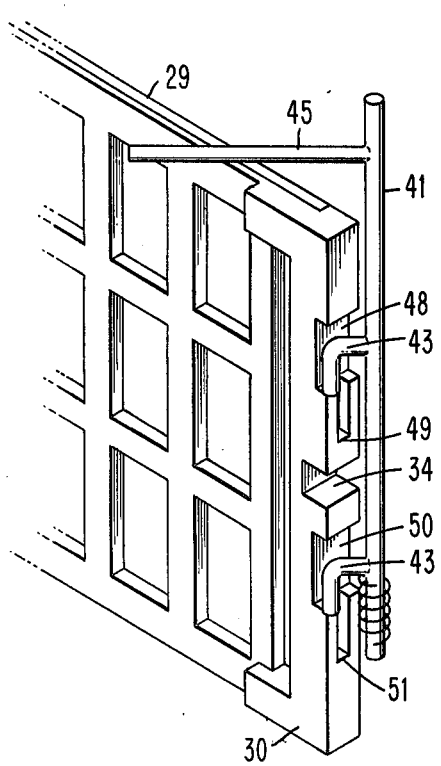
FIG. 4 is an isometric view showing a planar board in unlatched position.

To remove the planar boards from the assembly, board 29 would be removed first by pushing the arms 45 on levers 41 and 42 down out of the shallow notches 47 and pivoting the levers to position the arms into the deep notches 46. Pivoting of the levers in this direction causes the fingers to coact with the vertical slots to move the stiffener 30 away from interposers 31 to disengage the I/O pins therefrom. This movement also places the levers in their raised position wherein the fingers 43 are moved out of the vertical slots 49 and 51 and into the horizontal slots 48 and 50 on stiffener 30, as shown in FIG. 4. The stiffener is now unlatched and the board and stiffener is easily removed from the guide pins 46. Similar operation of the levers 39 and 40 will unlatch board 24 for removal.

The framework 10 is provided with an opening 52 for access to the printed circuit cards and the framework is pivotally mounted at 53 to facilitate access to both the printed circuit cards and the planar boards.

The present package assembly provides a totally integrated package at the lowest possible total system cost. The unique leverage system is incorporated as a sub-assembly into the system frame where it is most cost effective. The planar boards are assembled positively and without error by placing over guide pins and seating with lever action. An important feature of the present leverage system it provides a mechanical advantage capable of overcoming over 100 pounds of spring contact force which is necessary for the insertion and extraction of planar boards. Also, it allows removal and replacement of planar boards within one minute instead of the previously required one hour for replacement of equivalent cards and boards. The present embodiment shows the use of two planar boards; however, more than two could be assembled to make a larger package.

While the invention has been particularly shown and described with reference to a preferred embodiment thereof, it will be understood by those skilled in the art that various changes in form and details may be made therein without departing from the spirit and scope of the invention.

What is claimed is:

1. An electronic circuit package comprising:
   a frame;
   a card-on-board circuit assembly mounted in said frame and having I/O pins on a planar surface of the card-on-board;
   a planar circuit board having I/O pins on a planar surface thereof;
   interposer members extending along each vertical edge of said card-on-board and having spring contacts for pluggable connecting corresponding I/O pins on said planar board and card-on-board assembly;
   means for retaining said interposer members pluggably connected to said I/O pins on said card-on-board assembly;
   a rectangular stiffener member for supporting said planar circuit board;
   means for guiding said stiffener and planar board to a position adjacent said interposer members;
   a pair of levers pivotally mounted on said frame, said levers extending along the vertical side edges of said positioned stiffener and planar board and operable to plug and unplug said I/O pins on the planar board into and out of the spring contacts on said interposer members; and
   detent means for latching said levers to retain the I/O pins on said planar board in plugged contact with the spring contacts on said interposer members.

2. An electronic circuit package comprising:
   a frame;
   a card-on-board circuit assembly mounted in said frame and having I/O pins on a planar surface of the card-on-board;
   a planar circuit board having I/O pins on a planar surface thereof;
   interposer members having extending along each vertical edge of said card-on-board and spring contacts for pluggably connecting corresponding I/O pins on said planar board and card-on-board assembly;
   means for retaining said interposer members pluggably connected to said I/O pins on said card-on-board assembly;
   a rectangular stiffener member for supporting said planar circuit board;
   means for guiding said stiffener and planar board to a position adjacent said interposer members;
   a pair of vertical levers mounted on said frame for pivotal rotation and for vertical movement, said levers extending along the vertical side edges of said positioned stiffener and planar board;
   at least one vertical slot on each vertical side edge of said stiffener member;
   at least one protruding finger on each of said levers, said levers being operable to seat said fingers in said vertical slots and move said positioned stiffener and planar board to plug and unplug said I/O pins on the planar board into and out of the spring contacts on said interposer members; and
   detent means for latching said levers when said I/O pins are either plugged or unplugged from said interposer members.

3. An electronic circuit package as set forth in claim 2 wherein each said lever includes a horizontally extending arm portion at the top and spring biasing means at the bottom for urging said levers upward, and said detent means comprises a pair of blocks attached to said frame and having notches into which said arm portions seat to latch said levers.

4. An electronic circuit package comprising:
   a frame;
   a card-on-board circuit assembly mounted in said frame and having I/O pins on a planar surface of the card-on-board;
   a first planar circuit board having I/O pins on opposite planar surfaces thereof;
   first interposer members extending along each vertical edge of said card-on-board and having spring contacts for pluggably connecting corresponding I/O pins on one surface of said planar board and card-on-board assembly;
   means for retaining said interposer members pluggably connected to said I/O pins on said card-on-board assembly;
   a first rectangular stiffener member for supporting said first planar circuit board;
   a second planar circuit board having I/O pins on at least one planar surface thereof;
   a second rectangular stiffener member for supporting said second planar circuit board;
   second interposer members extending along each vertical edge of said first planar circuit board and having spring contacts for pluggably connecting corresponding I/O pins on said first and second planar circuit boards;
   means for retaining said second interposer members pluggably connected to I/O pins on said first planar circuit board;
   means for guiding said first stiffener and planar circuit board to a position adjacent said first interposer members and said second stiffener and planar circuit board to a position adjacent said second interposer members;
   two pair of vertical levers mounted on said frame for pivotal rotation and for vertical movement, said levers extending along the vertical side edges of said positioned first and second stiffeners and planar boards;

at least one vertical slot on each vertical side edge of said stiffeners;

at least one protruding finger on each of said levers, said levers being operable to seat said fingers in said vertical slots and move said positioned stiffeners and planar boards to plug and unplug said I/O pins on the planar boards into and out of the spring contacts on the respective interposer members; and detent means for latching said levers when said I/O pins are either plugged or unplugged from said interposer members.

5. An electronic circuit package comprising:

a frame;

a card-on-board circuit assembly mounted in said frame and having I/O pins on a planar surface of the card-on-board;

a planar circuit board having I/O pins on a planar surface thereof;

interposer members extending along each vertical edge of said card-on-board and having spring contacts for pluggably connecting corresponding I/O pins on said planar board and card-on-board assembly;

means for retaining said interposer members pluggably connected to said I/O pins on said card-on-board assembly;

a rectangular stiffener member for supporting said planar circuit board;

means for guiding said stiffener and planar board to a position adjacent said interposer members;

a pair of vertical levers mounted on said frame for pivotal rotation and for vertical movement, said levers extending along the vertical side edges of said positioned stiffener and planar board;

at least one horizontal slot and one vertical slot on each vertical side edge of said stiffener member;

at least one protruding finger on each of said levers, said fingers protruding in the horizontal slots on said stiffener when the stiffener is positioned adjacent said interposer members and said levers being operable to seat said fingers in said vertical slots and move said positioned stiffener and planar board to plug and unplug said I/O pins on the planar board into and out of the spring contacts on said interposer members; and detent means for latching said levers with the fingers in the horizontal slots for an unplugged condition or in said vertical slots for a plugged condition.

6. An electronic circuit package as defined in claim 5 wherein said vertical slots communicate with said horizontal slots to allow movement of said fingers from one to the other.

* * * * *